United States Patent
Shirahama et al.

(10) Patent No.: US 7,057,956 B2
(45) Date of Patent: Jun. 6, 2006

(54) SEMICONDUCTOR INTEGRATED CIRCUIT DEVICE AND METHOD FOR TESTING THE SAME

(75) Inventors: Masanori Shirahama, Shiga (JP); Masashi Agata, Osaka (JP); Toshiaki Kawasaki, Osaka (JP); Ryuji Nishihara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 128 days.

(21) Appl. No.: 10/928,366

(22) Filed: Aug. 30, 2004

(65) Prior Publication Data

US 2005/0047236 A1  Mar. 3, 2005

(30) Foreign Application Priority Data

Sep. 1, 2003 (JP) .............................. 2003-308613

(51) Int. Cl.
*G11C 7/00* (2006.01)
(52) U.S. Cl. ........................ 365/205; 365/201; 365/207
(58) Field of Classification Search ................ 365/205, 365/201, 207, 189.05
See application file for complete search history.

(56) References Cited

U.S. PATENT DOCUMENTS

| 5,179,536 | A * | 1/1993 | Kasa et al. ................. 365/200 |
| 6,208,549 | B1 | 3/2001 | Rao et al. |
| 6,449,197 | B1 | 9/2002 | Hiraki et al. |
| 6,590,825 | B1 | 7/2003 | Tran et al. |
| 2002/0057604 | A1* | 5/2002 | Khouri et al. .............. 365/200 |
| 2004/0047184 | A1* | 3/2004 | Tran et al. ............. 365/185.21 |

FOREIGN PATENT DOCUMENTS

| JP | 3-178099 | 8/1991 |
| JP | 6-53521 | 2/1994 |
| JP | 2667099 | 6/1997 |
| JP | 3090329 | 7/2000 |

* cited by examiner

*Primary Examiner*—Tuan T. Nguyen
(74) *Attorney, Agent, or Firm*—McDermott Will & Emery LLP

(57) ABSTRACT

A semiconductor integrated circuit device includes: first and second nonvolatile memory elements; a first amplifier for amplifying an output signal from the first nonvolatile memory element to output the amplified signal; and a second amplifier for outputting to the first amplifier a control signal generated by amplifying an output signal from the second nonvolatile memory element. The second amplifier fixes the output signal from the first amplifier at a high potential or a low potential based on data stored in the second nonvolatile memory element.

17 Claims, 9 Drawing Sheets

SEMICONDUCTOR INTEGRATED CIRCUIT DEVICE AND METHOD FOR TESTING THE SAME

CROSS REFERENCE TO RELATED APPLICATIONS

This application claims priority under 35 U.S.C. § 119 to Japanese Patent Application No. 2003-308613 filed on Sep. 1, 2003, the entire contents of which are incorporated herein by reference.

BACKGROUND OF THE INVENTION (a) Fields of the Invention

The present invention relates to semiconductor integrated circuit devices in which logic circuits or logic circuits and memory circuits are integrated in one semiconductor chip and which are provided with nonvolatile memory elements as alternatives to fuse elements incorporated into the semiconductor integrated circuit device and determining operations of the circuits after fabrication of the device, particularly such as redundancy repair, functional expansion, or functional modification, and to methods for testing such a device.

(b) Description of Related Art

In recent large scale integrated circuits (LSI), an increase in circuit scale thereof and complication of functions incorporated therein are remarkable. As the speeds of data processing and signal processing are enhanced, the capacity of a memory integrated in an LSI increases irrespective of memory type. With this increase, it becomes necessary to make modification of the state of a semiconductor integrated circuit device by fuse elements after completion of fabrication of the device as a product, such as redundancy repair of memories, expansion or modification of logic functions, accuracy adjustment of analog circuits, and such a necessity tends to increase irrespective of the scale and the accuracy of the device.

The increase in the conventional adjustment functions made by fuse elements, however, increases the number of fuse elements, resulting in an increase in total area of the fuse elements on a semiconductor chip. Moreover, the semiconductor device has many restrictions against the fuse elements, such as that a metal interconnect cannot be provided in a layer above the fuse element.

As a solution of this disadvantage, a nonvolatile memory cell capable of being configured by a normal CMOS process without using the adjustment functions by fuse elements is shown in, for example, Japanese Patent Publication No. 2667099. This nonvolatile memory cell is formed by a CMOS process, composed of two transistors differing in conductivity type and having a common gate, and configured so that one transistor thereof is used as a control gate and the other transistor is used for input and output. That is to say, the common gate of the two transistors functions as a floating gate of a commonly used electronically erasable and programmable read only memory (EEPROM), thereby attaining a nonvolatile memory device.

An approach to improving the reliability of the nonvolatile memory device of CMOS configuration by differentially amplifying the device is shown in, for example, Japanese Patent Publication No. 3090329.

The most advanced semiconductor process at present is a fine process whose design rule is as small as about 0.13 µm. Moreover, a member constituting a transistor, for example, a gate insulating film has a reduced film thickness. Under such a circumstance, even if a MOS transistor is simply shrunk with the structure thereof kept, leakage current occurring in the shrunk MOS transistor increases, resulting in trouble with the long-term reliability of the transistor.

In addition, nonvolatile memory elements functioning as fuse elements also have a function that must be realized besides the long-term reliability.

To be more specific, in the case of using a fuse element, either the short-circuit state or the floating state appears uniquely between two terminals of the fuse element regardless of whether the fuse is made of metal or polysilicon.

In contrast to this, in the case of using one nonvolatile memory element and an amplifier or a differential amplifier for this element, the state of charge accumulation of a floating gate constituting the nonvolatile memory element of CMOS configuration is not always determined uniquely because it depends on a process in device fabrication.

Moreover, in the case of employing a differential amplifier, two nonvolatile memory elements connected to the differential amplifier are equal in floating gate potential, so that the two elements have almost the same threshold value Vt. This causes a problem in which an output signal from the semiconductor integrated circuit device substituting for a fuse element and having multiple differential amplifiers cannot indicate a constant output result.

Specifically, for example, in the case where this semiconductor integrated circuit device is employed for redundancy repair of a memory device such as a dynamic random access memory (DRAM), a static random access memory (SRAM), or a read only memory (ROM), it is desirable that a uniquely determined potential selects a normal memory cell and the memory space of the selected cell is tested. However, in the case where nonvolatile memory elements are employed instead of fuse elements, the output results from the nonvolatile memory elements vary to hinder even a normal performance of the test.

SUMMARY OF THE INVENTION

With the foregoing in mind, an object of the present invention is to use a nonvolatile memory element as an alternative to a fuse element to match, even if a differential amplifier is used to amplify data stored in the nonvolatile memory element, the output result of the memory element in the state not being blown as a fuse element with the output result of the differential amplifier at the completion of device fabrication.

To accomplish the above object, in the present invention, a plurality of nonvolatile memory elements constituting a semiconductor integrated circuit device and a plurality of amplifiers for amplifying respective data pieces stored in the elements are divided into a first group whose elements and amplifiers are connected to components to be controlled and a second group whose elements and amplifiers have the function of fixing output potentials of the amplifiers belonging to the first group.

To be more specific, a semiconductor integrated circuit device of the present invention comprises: first and second nonvolatile memory elements; a first amplifier for amplifying an output signal from the first nonvolatile memory element to output the amplified signal; and a second amplifier for outputting to the first amplifier a control signal generated by amplifying an output signal from the second nonvolatile memory element. The second amplifier fixes an output signal from the first amplifier at a high potential or a low potential based on data stored in the second nonvolatile memory element.

In the semiconductor integrated circuit device of the present invention, the second amplifier fixes the output signal from the first amplifier uniquely either at a high potential or at a low potential based on data (starting data) stored in the second nonvolatile memory element. Therefore, for example, in the state in which a high potential is not written in (programmed into) the second nonvolatile memory element, the output value of the first nonvolatile memory element through the first amplifier can be fixed at a high potential or a low potential determined by the starting data stored in the second nonvolatile memory element. From this, in the case of employing the semiconductor integrated circuit device of the present invention as an alternative to a fuse element, the state in which the fuse element is not blown is equivalent to the state at the time of test before the fuse element is blown. In contrast to this, if the state of being blown as the fuse element, that is to say, writing operation on the second nonvolatile memory element is necessary, for example, a high potential is written in the second nonvolatile memory element and data (control data) is written in the first nonvolatile memory element. By this procedure, the resulting device becomes equivalent to the state in which the fuse element is blown.

Preferably, in the semiconductor integrated circuit device of the present invention, the output signal from the first amplifier is determined by a single control signal. With this, simply by supplying the first amplifier connected to the first nonvolatile memory element with starting data stored in the second nonvolatile memory element as a control signal, the output value from the first amplifier can be fixed at a high potential or a low potential.

Preferably, in the semiconductor integrated circuit device of the present invention, a third nonvolatile memory element is included, and the first amplifier is a first differential amplifier having a plurality of transistors of which gates of at least two transistors receive output signals from the first and third nonvolatile memory elements. This provides a configuration of a differential-type nonvolatile memory device capable of maintaining high reliability. Therefore, even if both of threshold values of the multiple nonvolatile memory elements at a high level and threshold values thereof at a low level are degraded to a certain degree, the output result of the differential amplifier will not change.

Preferably, in the above case, the first differential amplifier receives a control signal for determining the output value of the first differential amplifier to fix the output signal of the first differential amplifier at a high potential, thereby inactivating the first differential amplifier. In this manner, the state of the device is brought into correspondence with the state in which the fuse element is not blown, whereby the output result as the memory device can be fixed and an unnecessary logic circuit can be eliminated.

Preferably, in the semiconductor integrated circuit device of the present invention, the semiconductor integrated circuit device includes a plurality of pairs each consisting of the second nonvolatile memory element and the second amplifier, and control signals each output from the second amplifier in each of the plurality of pairs are subjected to an OR operation to output the resulting signal to the first amplifier. With this, even if the second nonvolatile memory element is a single cell and data stored thereby is at a high level, the control signal can be obtained as a result of the OR operation on the output signals from the plurality of first nonvolatile memory elements. Therefore, the reliability of the stored data (starting data) can be improved.

Preferably, in the semiconductor integrated circuit device of the present invention, the control signal output from the second amplifier as well as a reading signal are subjected to an AND operation to output the resulting signal to the first amplifier. With this, current is consumed only when the reading signal is input and writing operation on the first nonvolatile memory element is performed, so that power consumption can be reduced.

Preferably, in the semiconductor integrated circuit device of the present invention, a fourth nonvolatile memory element is included, the second amplifier is a second differential amplifier having a plurality of transistors of which gates of at least two transistors receive output signals from the second and fourth nonvolatile memory elements, the semiconductor integrated circuit device includes one or more groups each consisting of the second and fourth nonvolatile memory elements and the second differential amplifier, and the second differential amplifier outputs the control signal. With this, the reliability of data stored in the second nonvolatile memory cell can be equal to or more than the data reliability of the first nonvolatile memory element storing control data used for a circuit for a control target.

Preferably, in the above case, the control signal output from the second amplifier as well as a reading signal are subjected to an AND operation to output the resulting signal to the first amplifier. This provides a high reliability and reduces power consumption.

Preferably, in the above case, the control signal output from the second differential amplifier is generated by performing an AND operation on a reading signal and an external signal input to an external input terminal, and the generated signal is output to the first amplifier. With this, even if a program is not conducted at all on the first and second nonvolatile memory elements in the state after completion of device fabrication, a suitable signal input from the external input terminal allows the output value of the first amplifier to be uniquely fixed.

Preferably, in the case where the semiconductor integrated circuit device of the present invention includes an external input terminal, the external input terminal is used for a test process after fabrication of the device, and by activating the second differential amplifier after the test process, the first amplifier becomes activated and the external input terminal is fixed at a predetermined voltage level. With this, after the semiconductor device including the semiconductor integrated circuit device of the present invention is fabricated, the external input terminal is used in the test process in the early stage of the device fabrication such as a wafer probe test, and subsequently a signal is applied to the external input terminal so that the second differential amplifier becomes activated. Thus, the data stored in the first nonvolatile memory element can be read. Moreover, no load is applied to the control signal generated by the external input terminal.

Preferably, in the semiconductor integrated circuit device of the present invention, the first nonvolatile memory element and the second nonvolatile memory element each comprise: a p-type transistor whose source and drain and a substrate are connected to one another to form a control gate; and an n-type transistor whose gate is connected to a gate of the p-type transistor to form a floating gate. Since memory elements of CMOS configuration are employed as the first and second nonvolatile memory elements, the device can be fabricated more easily than the device using a normal EEPROM.

A first method for testing a semiconductor integrated circuit device according to the present invention is designed for a semiconductor integrated circuit device which comprises: first and second nonvolatile memory elements; a first amplifier for amplifying an output signal from the first nonvolatile memory element to output the amplified signal; and a second amplifier for outputting to the first amplifier a control signal generated by amplifying an output signal from the second nonvolatile memory element. If the threshold value of the second nonvolatile memory element obtained after fabrication of the device is relatively low and a program for determining data to be stored in the first nonvolatile memory element is unnecessary, a program for the second nonvolatile memory element is not conducted. If the threshold value of the second nonvolatile memory element after the device fabrication is relatively high and the program for determining data to be stored in the first nonvolatile memory element is necessary, data for activating the first amplifier is programmed into the second nonvolatile memory element determining the output potential of the first amplifier and predetermined data is written in the first nonvolatile memory element.

With the first method for testing a semiconductor integrated circuit device, a test can be carried out easily and reliably on a circuit to be controlled which receives an output from the first nonvolatile memory element. Moreover, based on the result of the test, required data can be written in the first nonvolatile memory element.

A second method for testing a semiconductor integrated circuit device according to the present invention is designed for a semiconductor integrated circuit device which comprises: first, second and third nonvolatile memory elements; a first amplifier for amplifying an output signal from the first nonvolatile memory element to output the amplified signal; and a second amplifier for outputting to the first amplifier a control signal generated by amplifying an output signal from the second nonvolatile memory element, the second amplifier being a differential amplifier having a plurality of transistors of which gates of at least two transistors receive output signals from the second and third nonvolatile memory elements, the semiconductor integrated circuit device including one or more groups each consisting of the second and third nonvolatile memory elements and the differential amplifier, the differential amplifier outputting the control signal, the control signal being generated by performing an AND operation on a reading signal and an external signal input to an external input terminal, the generated signal being output to the first amplifier. This method comprises: a first step of erasing, if the threshold value of the second nonvolatile memory element after fabrication of the device is relatively high, data pieces stored in the first nonvolatile memory element and the second nonvolatile memory element; and a second step of inputting a signal for test from the external input terminal to test a target circuit receiving the output signal from the first amplifier.

With the second method for testing a semiconductor integrated circuit device, a test can be carried out easily and reliably on a circuit to be controlled which receives an output from the first nonvolatile memory element. Moreover, based on the result of the test, required data can be written in the first nonvolatile memory element.

A third method for testing a semiconductor integrated circuit device according to the present invention is designed for a semiconductor integrated circuit device which comprises: first, second and third nonvolatile memory elements; a first amplifier for amplifying an output signal from the first nonvolatile memory element to output the amplified signal; and a second amplifier for outputting to the first amplifier a control signal generated by amplifying an output signal from the second nonvolatile memory element, the second amplifier being a differential amplifier having a plurality of transistors of which gates of at least two transistors receive output signals from the second and third nonvolatile memory elements, the semiconductor integrated circuit device including one or more groups each consisting of the second and third nonvolatile memory elements and the differential amplifier, the differential amplifier outputting the control signal, the control signal being generated by performing an AND operation on a reading signal and an external signal input to an external input terminal, the generated signal being output to the first amplifier. This method comprises the steps of: inputting a signal to the external input terminal so that the differential amplifier becomes inactivated and fixing the output signal of the differential amplifier at a high level or a low level, thereby carrying out a test with the output value of the first amplifier fixed at the same value as or the inverse value of the output value of the differential amplifier; conducting, if a program for determining data to be stored in the first nonvolatile memory element is unnecessary, a program on the second nonvolatile memory element so that the differential amplifier becomes inactivated; and conducting, if the program for determining data to be stored in the first nonvolatile memory element is necessary, a program on the second nonvolatile memory element so that the differential amplifier becomes activated and writing predetermined data in the first nonvolatile memory element.

With the third method for testing a semiconductor integrated circuit device, a test can be carried out easily and reliably on a circuit to be controlled which receives an output from the first nonvolatile memory element. Moreover, this method can be controlled by the signal input from the external input terminal, which facilitates setting of the test. Therefore, based on the result of the test, required data can be written in the first nonvolatile memory element.

In the first to third methods for testing a semiconductor integrated circuit device, the first nonvolatile memory element and the second nonvolatile memory element each comprise: a p-type transistor whose source and drain and a substrate are connected to one another to form a control gate; and an n-type transistor whose gate is connected to a gate of the p-type transistor to form a floating gate.

DETAILED DESCRIPTION OF THE PREFERRED EMBODIMENTS

First Embodiment

A first embodiment of the present invention will be described with reference to accompanying drawings.

Figure 1:
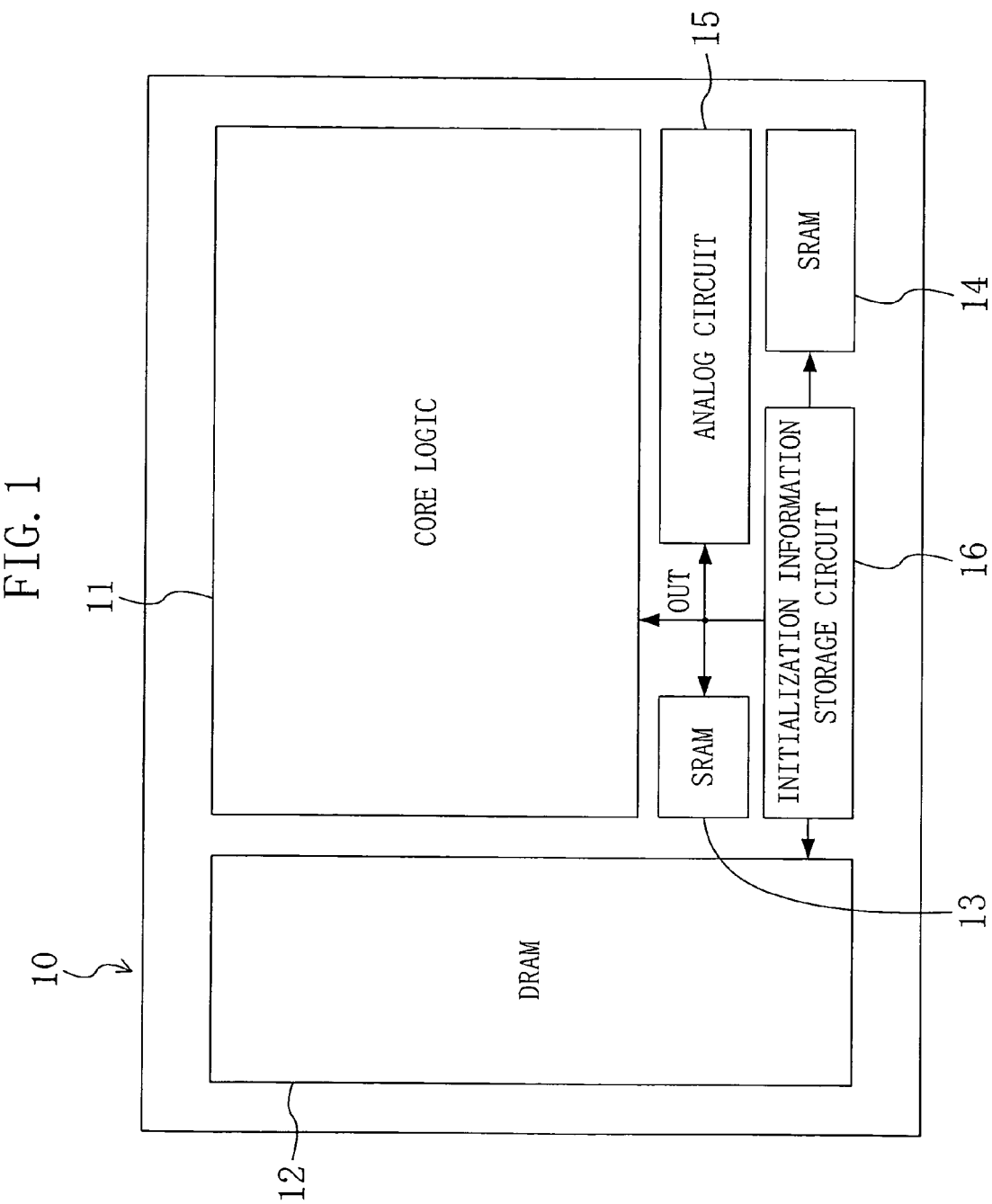
FIG. 1 is a block diagram showing a semiconductor device including an initialization information storage circuit as an alternative to a fuse element according to first to fourth embodiments of the present invention.

FIG. 1 shows a block configuration of a semiconductor device including an initialization information storage circuit as an alternative to a fuse element according to the first embodiment of the present invention.

Referring to FIG. 1, a semiconductor device 10 on a chip is a so-called system LSI. The semiconductor device 10 includes a logic circuit (core logic) 11 for controlling the whole of the semiconductor device 10, a DRAM circuit 12 having a relatively large storage capacity, first and second SRAM circuits 13 and 14 having relatively small storage capacities, an analog circuit 15, and an initialization information storage circuit 16 including a nonvolatile memory element as an alternative to a fuse element and sending control signals of various types to the circuits 11 to 15.

In the initialization information storage circuit 16 characterizing the present invention, data for making redundancy repair for the DRAM circuit 12 and the first and second SRAM circuits 13 and 14, data for adjusting the potential of an internal power supply, or the like is stored (programmed) at the time of test. At the time of an actual use of the stored data, based on initialization data stored in the initialization information storage circuit 16, determination of addresses targeted for the redundancy repair or level adjustment of an internal power source potential is carried out on the DRAM circuit 12 and the first and second SRAM circuits 13 and 14.

Furthermore, at the time of product test, a voltage level suitable for an internal power supply potential is determined from the measurement result by the analog circuit 15, and the determination result is written in the initialization information storage circuit 16. At the time of an actual use of the written result, based on an output signal from the initialization information storage circuit 16, the analog circuit 15 adjusts the threshold value, the output level, or other items of a predetermined circuit.

Consequently, at the time of completion of the test, the initialization information determined in accordance with the test results or the specifications of the circuits 11 to 15 is written in the initialization information storage circuit 16.

Figure 2:
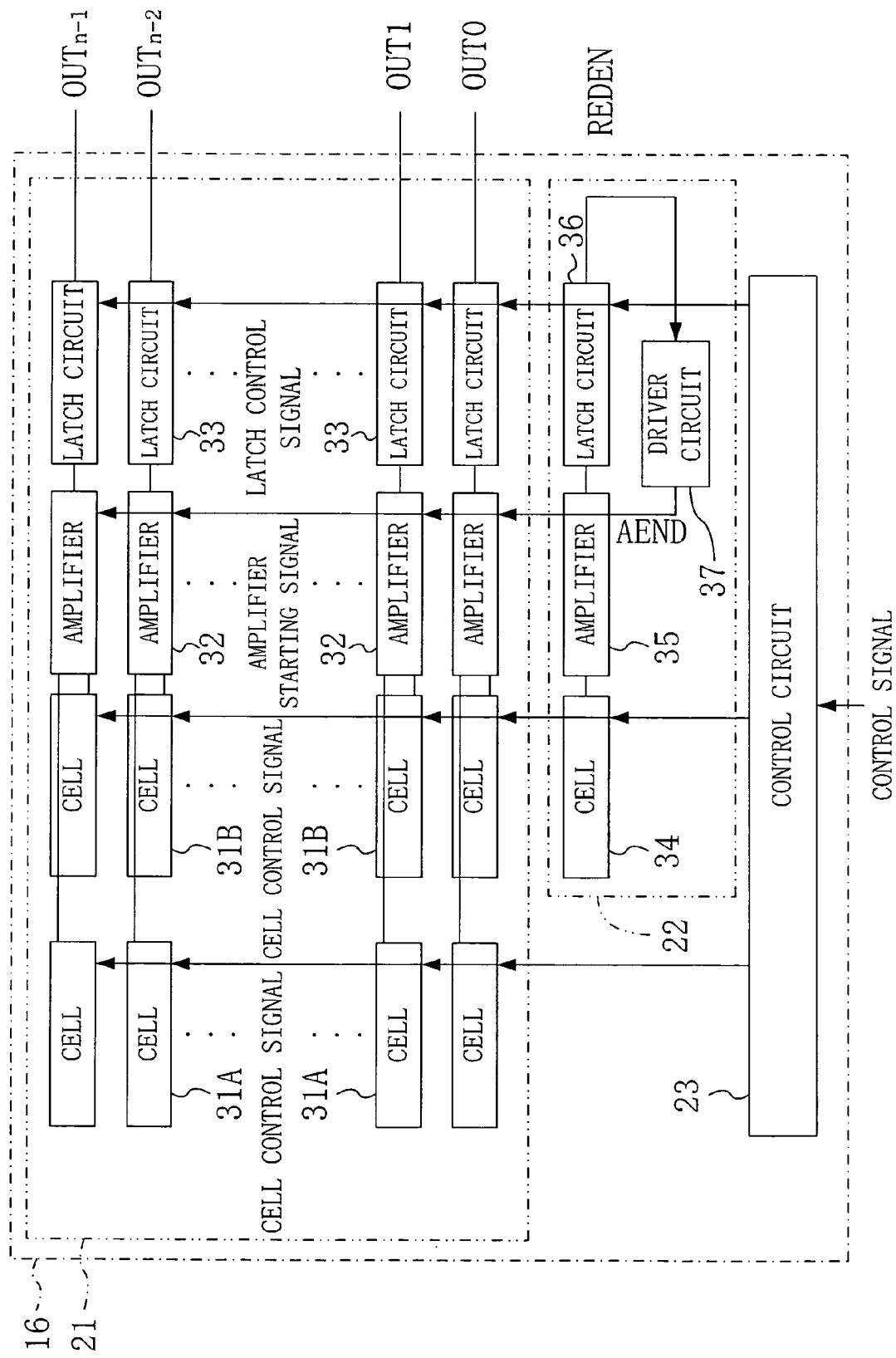
FIG. 2 is a block diagram showing the initialization information storage circuit according to the first embodiment of the present invention.

FIG. 2 shows an exemplary configuration of the initialization information storage circuit 16 according to the first embodiment.

Referring to FIG. 2, the initialization information storage circuit 16 is composed of an initialization information storage unit 21, a starting unit 22, and a control circuit unit 23. Into the initialization information storage unit 21, data (control data) is programmed which determines redundancy repair or the like as an alternative to a conventional fuse element. The starting unit 22 determines whether or not the data stored in the initialization information storage unit 21 is used. The control circuit unit 23 sends a control signal to the initialization information storage unit 21 and the starting unit 22.

The initialization information storage unit 21 includes first and second memory cells 31A and 31B, differential amplifiers 32, and latch circuits 33. The first and second memory cells 31A and 31B are each composed of a nonvolatile memory element retaining 1-bit information, and the two cells are complementary to each other. The differential amplifiers 32 each amplify and output minute data signals output from the first memory cell 31A and the second memory cell 31B. The latch circuits 33 each latch the data signal amplified by the differential amplifier 32 to output the resulting output signal OUT.

One circuit group consisting of the first and second memory cells 31A and 31B, the differential amplifier 32 and the latch circuit 33 corresponds to one fuse element. The initialization information storage unit 21 in this configuration contains n circuit groups (where n is an integer equal to or more than one), so that it is substitutable for n fuse elements.

The starting unit 22 is configured similarly to the first memory cell 31A or the like, and includes a starting memory cell 34, an amplifier 35, a latch circuit 36, and a driver circuit 37. The starting memory cell 34 stores starting data on whether the individual differential amplifiers 32 of the initialization information storage unit 21 are started or not. The amplifier 35 amplifies a minute data signal output from the starting memory cell 34 to output the amplified signal. The latch circuit 36 latches the starting signal amplified by the amplifier 35 to output the resulting control signal REDEN. The driver circuit 37 supplies the control signal REDEN from the latch circuit 36 to the differential amplifiers 32.

The control circuit 23 sends a cell control signal to the first memory cells 31A and the second memory cells 31B of the initialization information storage unit 21 and a latch control signal to the latch circuits 33.

If variation among the semiconductor devices 10 caused by the fabrication process thereof is narrow and the threshold values Vt of the floating gates of the memory cells 31A, 31B, and 34 obtained after completion of floating gate fabrication thereof are low, the threshold value Vt of the starting memory cell 34 also exhibits a relatively low value. Therefore, a cell transistor constituting the starting memory cell 34 with a low threshold value is easily activated, that is, easily brought into conduction. If the source thereof is connected to a grounded power supply, the amplifier 35 and the latch circuit 36 also output the control signal REDEN with a low potential.

Moreover, at an early stage after the wafer fabrication process, the differential amplifiers 32 would output random output results OUT0 to OUTn−1 each depending on the threshold values Vt of the first and second memory cells 31A and 31B. In the first embodiment, however, if the threshold value Vt of the starting memory cell 34 is stable at a low value, the differential amplifiers 32 of the initialization information storage unit 21 are certainly inactivated as the initial state to fix the output signals OUT0 to OUTn−1 thereof at a high level or a low level. The resulting initialization information storage unit 21 can output uniquely determined control data with reliability.

Figure 3:
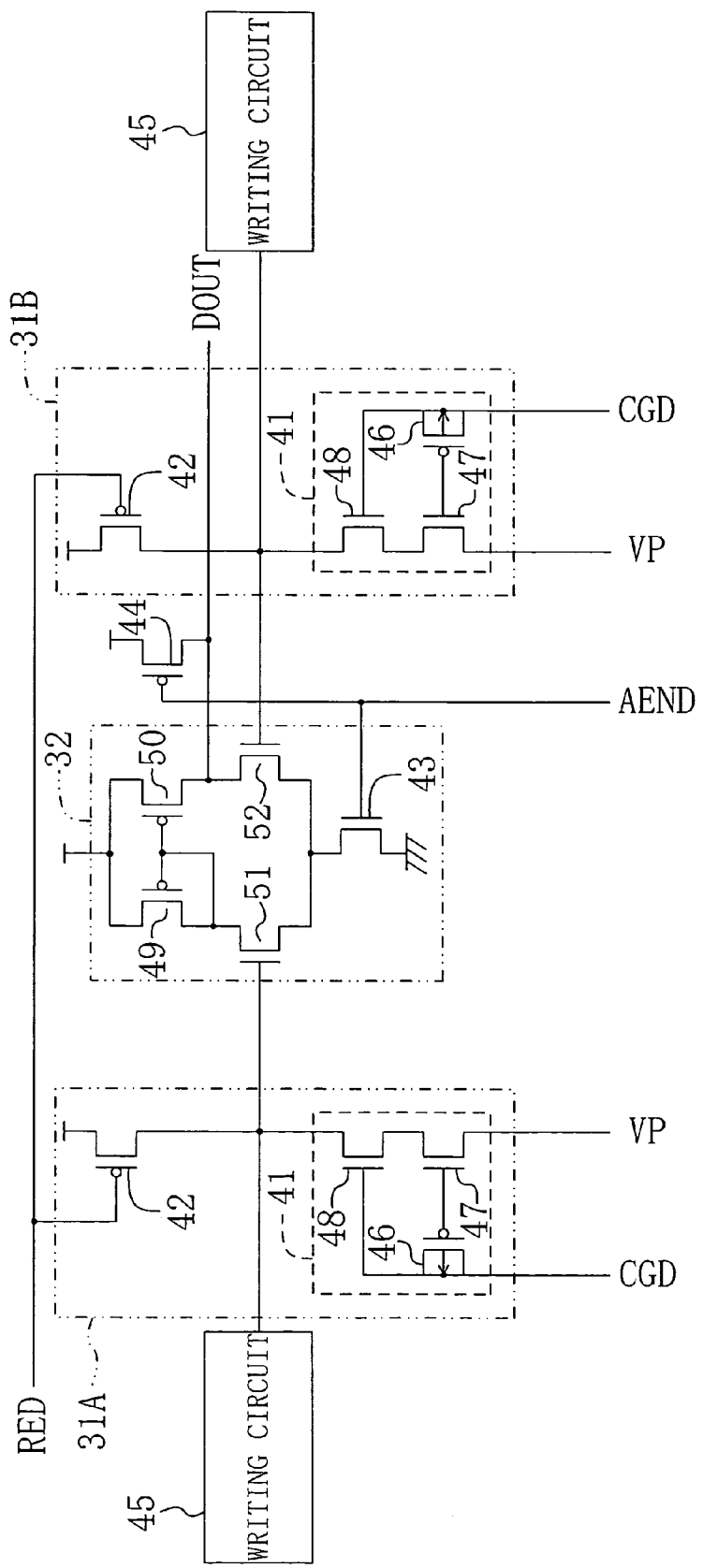
FIG. 3 is a circuit diagram showing a first memory cell, a second memory cell, and a differential amplifier according to the first to fourth embodiments of the present invention.

FIG. 3 shows an example of a concrete configuration of the first memory cells 31A, the second memory cell 31B, and the differential amplifier 32 according to the first embodiment.

Referring to FIG. 3, the first and second memory cells 31A and 31B each include a nonvolatile memory element 41 and a Pch load transistor 42. The nonvolatile memory element 41 is composed of a Pch transistor 46 whose source and drain and a substrate are connected to one another to form a control gate, a first Nch transistor 47 whose gate is connected to a gate of the Pch transistor 46 to form a floating gate, and a second Nch transistor 48 for input and output whose source and gate are connected to a drain of the first Nch transistor 47 and a drain of the Pch transistor 46, respectively. In the Pch load transistor 42, the gate receives an internal reading signal RED, the potential of a power supply is applied to the source, and the drain is connected to the drain of the second Nch transistor 48. The Pch load transistor 42 determines the potential for read operation from the nonvolatile memory element 41.

In the nonvolatile memory element 41, a control gate control signal CGD is applied to the source of the Pch transistor 46, and a ground potential VP is applied to the source of the first Nch transistor 47.

The differential amplifier 32 includes a first Pch transistor 49, a second Pch transistor 50, a third Nch transistor 51, a fourth Nch transistor 52, and a fifth Nch transistor 43. The first and second Pch transistors 49, 50 have a common source to which the power supply potential is applied. The third Nch transistor 51 has a drain connected to a drain and a gate of the first Pch transistor 49, and has a gate receiving an output signal (data signal) from the first memory cell 31A. The fourth Nch transistor 52 has a drain connected to a drain of the second Pch transistor 50, and has a gate receiving an output signal (data signal) from the second memory cell 31B. The fifth Nch transistor 43 has a drain connected to a common source of the third and fourth Nch transistors 51, 52, and has a source grounded. The gate of the fifth Nch transistor 43 receives an amplifier starting signal AEND from the starting unit 22 to activate or inactivate the differential amplifier 32.

A third Pch transistor 44 is further provided whose source receives the power supply potential, whose drain receives an output from the differential amplifier 32, and whose gate receives an amplifier starting signal AEND, thereby fixing the potential of an output signal DOUT from the differential amplifier 32 at a high level.

In the first embodiment, the potential of the output signal DOUT from the differential amplifier 32 is fixed by the amplifier starting signal AEND at a high level. In contrast to this, the first embodiment may employ the configuration in which the potential of the output signal DOUT is fixed at a low level.

Writing circuits 45 are connected to respective output terminals of the first and second memory cells 31A and 31B. For example, electrons are injected to the floating gate of the nonvolatile memory element 41 of the second memory cell 31B to raise the threshold value of the first Nch transistor 47, while no electron is injected to the floating gate of the nonvolatile memory element 41 of the first memory cell 31A. With this procedure, complementary data pieces can be written in the first and second memory cells 31A and 31B, respectively.

Operations of the first and second memory cells 31A and 31B and the differential amplifier 32 will be roughly described below.

For example, when the internal reading signal RED transitions to a low level and the control gate control signal CGD transitions to a high level, the output potentials corresponding to the amounts of accumulated charges in the floating gates of the respective nonvolatile memory elements 41 constituting the first memory cell 31A and the second memory cell 31B are supplied to the gates of the third and fourth Nch transistors 51, 52 constituting the differential amplifier 32.

At this time, if no starting data is programmed into (written in) the nonvolatile memory element constituting the starting memory cell 34 of the starting unit 22 and having the same configuration as the nonvolatile memory element 41 of the first memory cell 31A, the first Nch transistor of the starting memory cell 34 has a relatively low threshold value and thereby allowing the starting memory cell 34 to output the output signal at a grounded potential and to certainly become a low level. Therefore, the amplifier starting signal AEND from the starting unit 22 becomes a low level, so that the uniquely fixed output signals OUT0 to OUTn−1 can be supplied to the circuits 11 to 15 of the semiconductor device 10.

On the other hand, another case is provided where, by the test result, control data is to be written in the nonvolatile memory elements 41 of the initialization information storage unit 21. In this case, in order to output the amplifier starting signal AEND at a high level capable of activating the differential amplifiers 32 of the initialization information storage unit 21, the nonvolatile memory element included in the starting unit 22 is previously programmed, that is, electrons are previously injected to the floating gates thereof. Thereafter, each of the nonvolatile memory elements 41 constituting the initialization information storage unit 21 has predetermined control data written.

Second Embodiment

A second embodiment of the present invention will be described below with reference to accompanying drawings.

Figure 4:
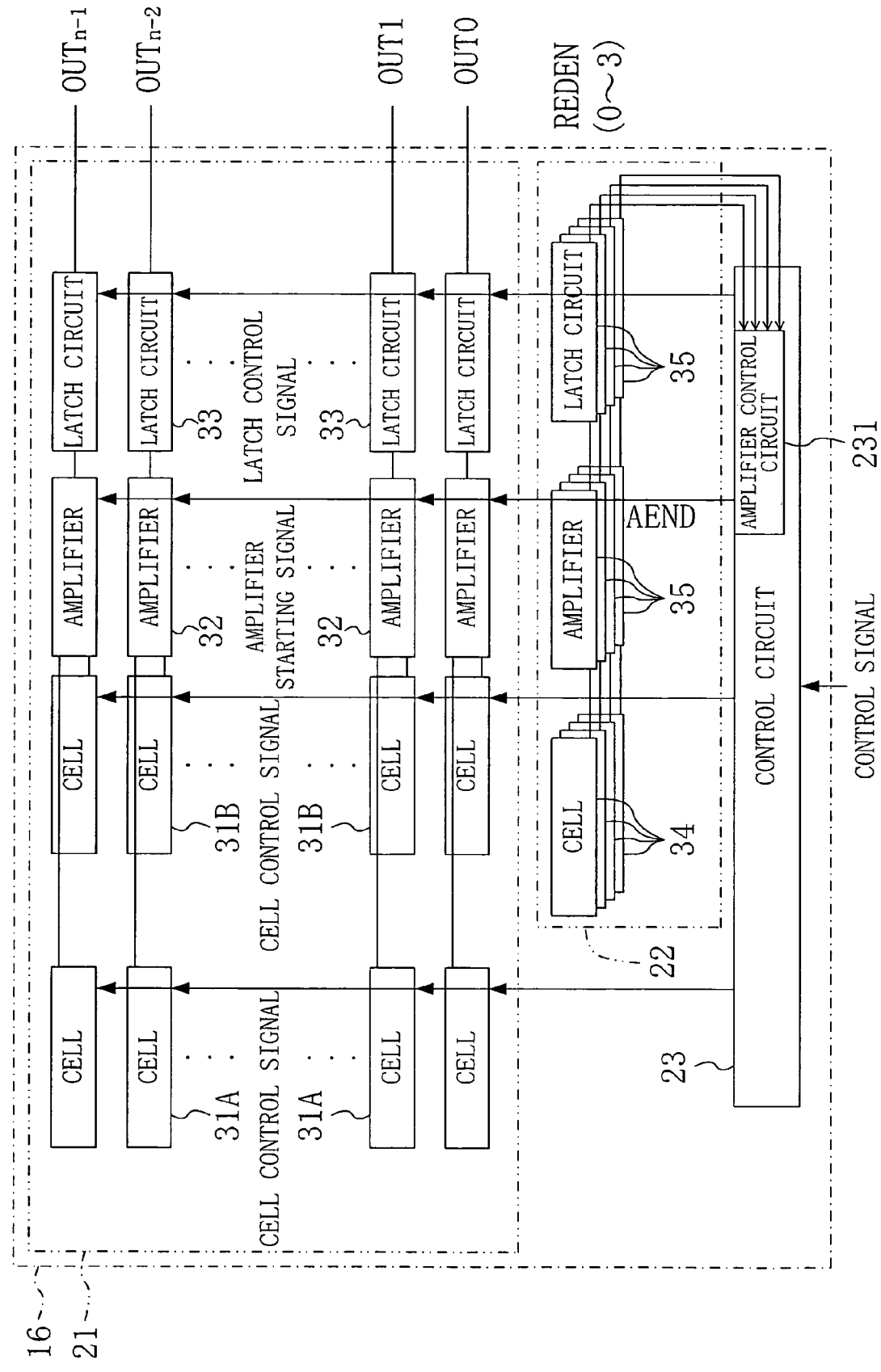
FIG. 4 is a block diagram showing an initialization information storage circuit according to the second embodiment of the present invention.

FIG. 4 shows an exemplary configuration of an initialization information storage circuit as an alternative to a fuse element according to the second embodiment of the present invention. The description of the components shown in FIG. 4 that are the same as those shown in FIG. 2 will be omitted by retaining the same reference numerals.

Referring to FIG. 4, the starting unit 22 constituting the initialization information storage circuit 16 according to the second embodiment is provided with four circuit groups each consisting of the starting memory cell 34, the amplifier 35, and the latch circuit 36. Respective output signals REDEN[0] to REDEN[3] from the four circuit groups are subjected to an OR operation by an amplifier control circuit 231 provided in the control circuit 23. Thus, when desired starting data is written in (programmed into) the starting memory cells 34, the written starting data can obtain a data storage reliability equal to that of data to be subjected to differential amplification.

Figure 5:
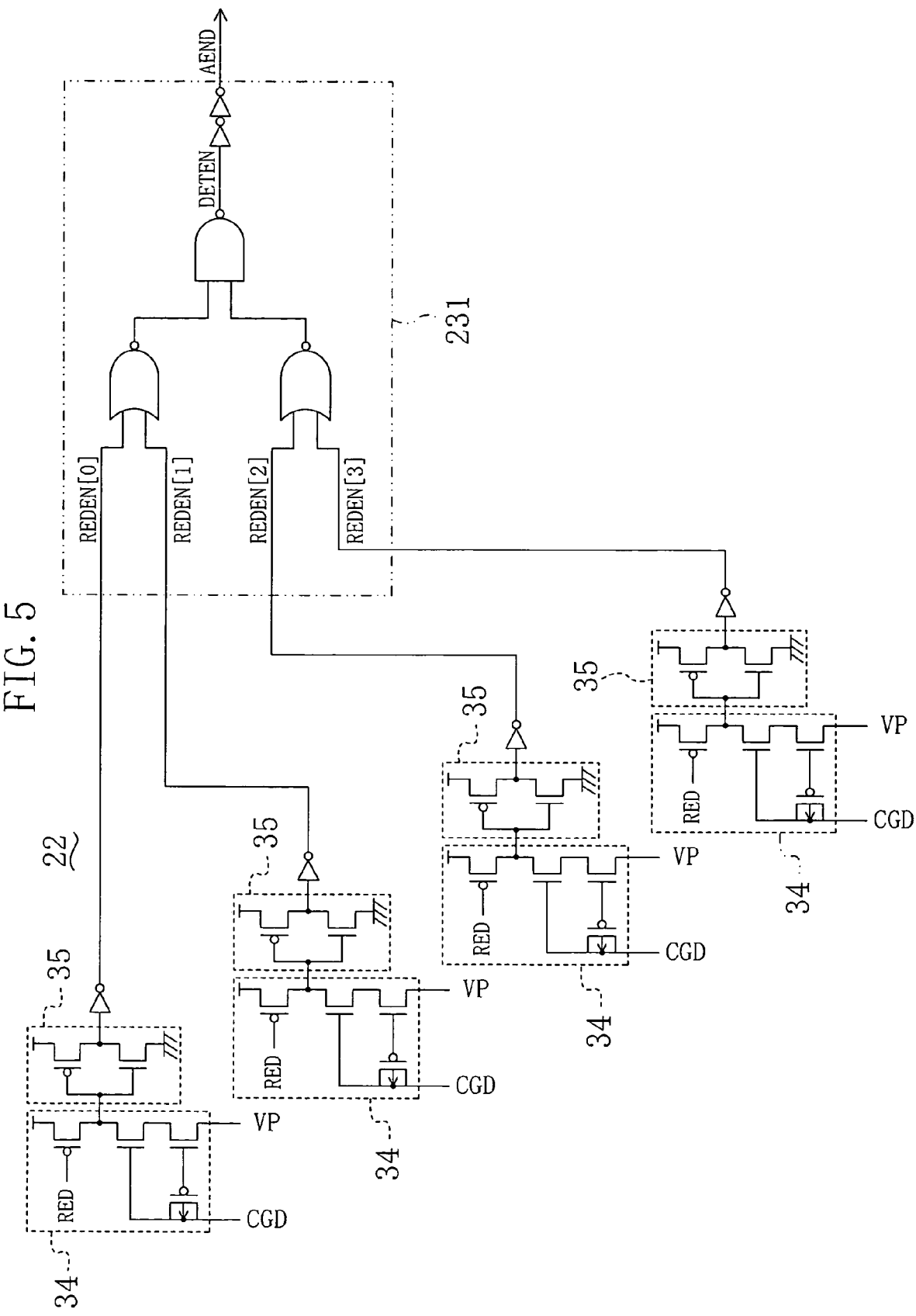
FIG. 5 is a circuit diagram showing a starting unit and an amplifier control circuit according to the second embodiment of the present invention.

FIG. 5 shows an exemplary configuration of the amplifier control circuit 231 and the four groups each containing the starting memory cell 34 and the amplifier 35. Referring to FIG. 5, the starting memory cell 34 is configured similarly to the first and second memory cells 31A and 31B, and the amplifier 35 is composed of a CMOS inverter.

The amplifier control circuit 231 includes a first two-input NOR circuit, a second two-input NOR circuit, a two-input NAND circuit, and a driver circuit. The first two-input NOR circuit receives output signals REDEN[0] and REDEN[1] from the amplifiers 35 of the two circuit groups. The second two-input NOR circuit receives output signals REDEN[2] and REDEN[3] from the amplifiers 35 of the other two circuit groups. The two-input NAND circuit performs an AND operation on output signals from these NOR circuits to output an internal starting signal DETEN. The driver circuit amplifies the internal starting signal DETEN to generate an amplifier starting signal AEND, and then supplies the generated signal to the differential amplifiers 32 of the initialization information storage unit 21.

As described above, with the second embodiment, the reliability of starting data stored in the starting unit 22 constituting the initialization information storage circuit 16 can be improved. Therefore, at the start, the amplifier starting signal AEND can reliably fix the output values of the differential amplifiers 32 of the initialization information storage unit 21.

Third Embodiment

A third embodiment of the present invention will be described below with reference to accompanying drawings.

Figure 6:
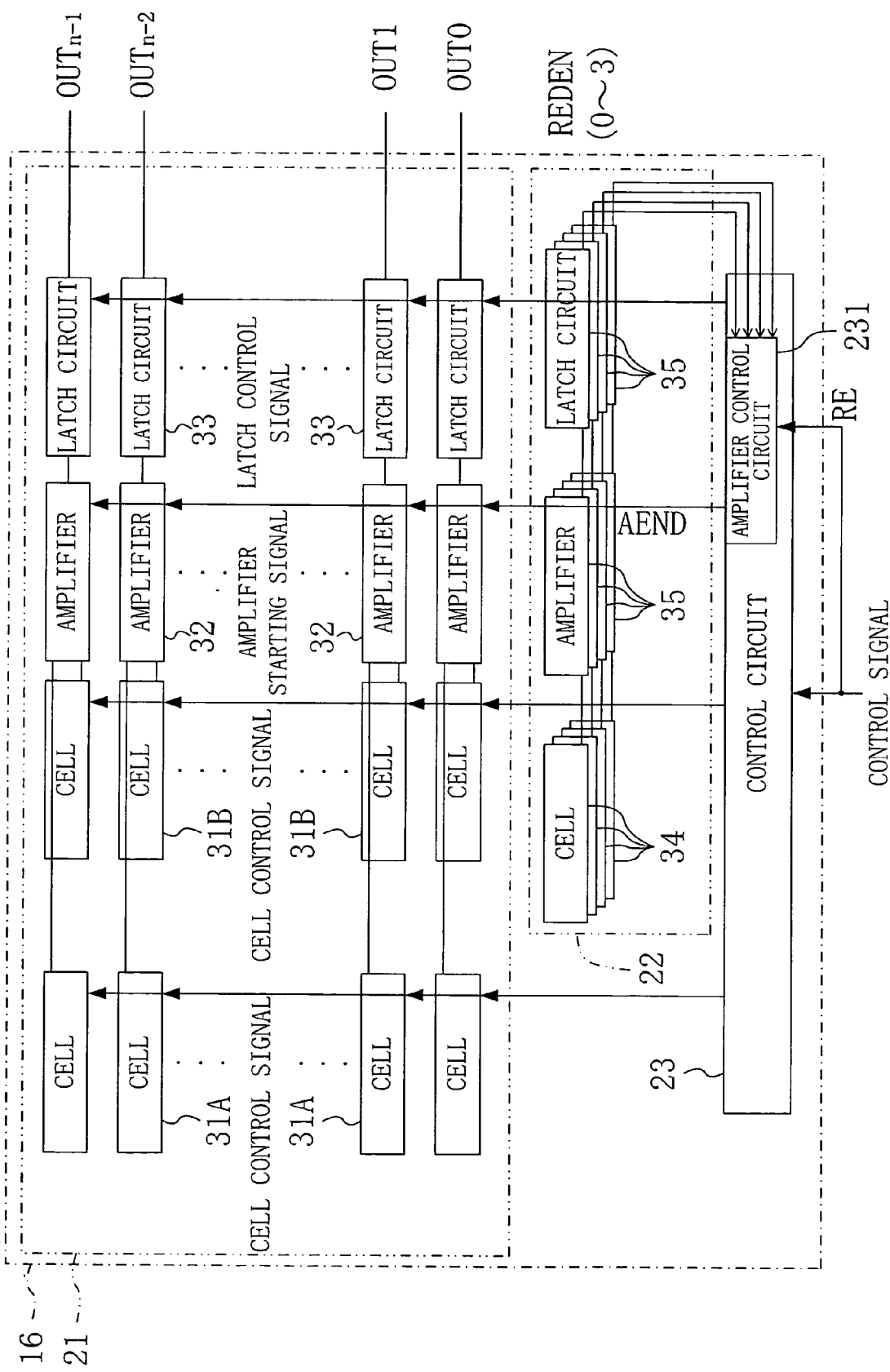
FIG. 6 is a block diagram showing an initialization information storage circuit according to the third embodiment of the present invention.

FIG. 6 shows an exemplary configuration of an initialization information storage circuit as an alternative to a fuse element according to the third embodiment of the present invention. The description of the components shown in FIG. 6 that are the same as those shown in FIG. 4 will be omitted by retaining the same reference numerals.

Referring to FIG. 6, the control circuit 23 according to the third embodiment is configured so that the amplifier control circuit 231 included in the control circuit 23 is supplied with an external reading signal RE through an external input terminal.

The initialization information storage unit 21 according to the first and second embodiments is supplied with the amplifier starting signal AEND in a state of being latched, so that the differential amplifiers 32 become activated even for a period during which reading operation is not performed.

Figure 7:
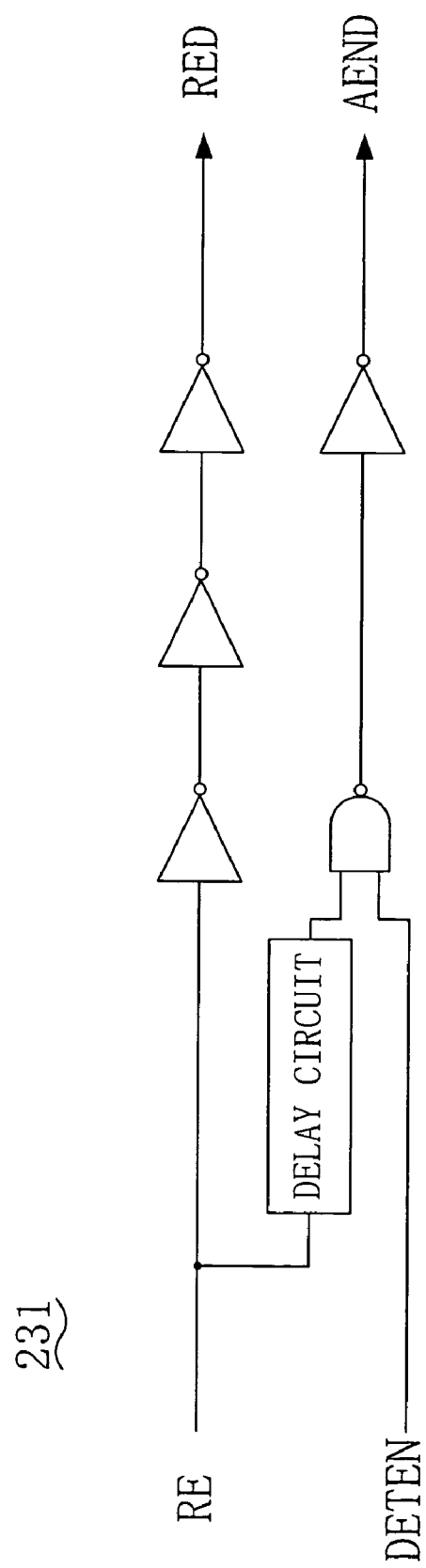
FIG. 7 is a circuit diagram showing main parts of an amplifier control circuit according to the third embodiment of the present invention.

To overcome such a disadvantage, in the third embodiment, as shown in FIG. 7, the external reading signal RE and the internal starting signal DETEN from the NAND circuit shown in FIG. 5 are subjected to an AND operation, and the resulting signal is output, as the amplifier starting signal AEND, to the initialization information storage unit 21.

Herein, a high active signal is used as the external reading signal RE. Therefore, in order to activate the differential amplifiers 32 constituting the initialization information storage unit 21, the starting memory cell 34 is made in the state of writing operation (in the state where electrons are injected) so that the internal starting signal DETEN becomes a high level. Further, only when the external reading signal RE becomes a high level, the amplifier starting signal AEND transitions to a high level. By this procedure, the differential amplifiers 32 of the initialization information storage unit 21 are started only for a period of reading operation.

On the other hand, for a period during which the external reading signal RE or the internal starting signal DETEN is at a low level, the amplifier starting signal AEND fixed at a low level is output. Therefore, the differential amplifiers 32 become inactivated, which eliminates unwanted current consumption for all period of time other than the period of reading operation.

Fourth Embodiment

A fourth embodiment of the present invention will be described below with reference to accompanying drawings.

Figure 8:
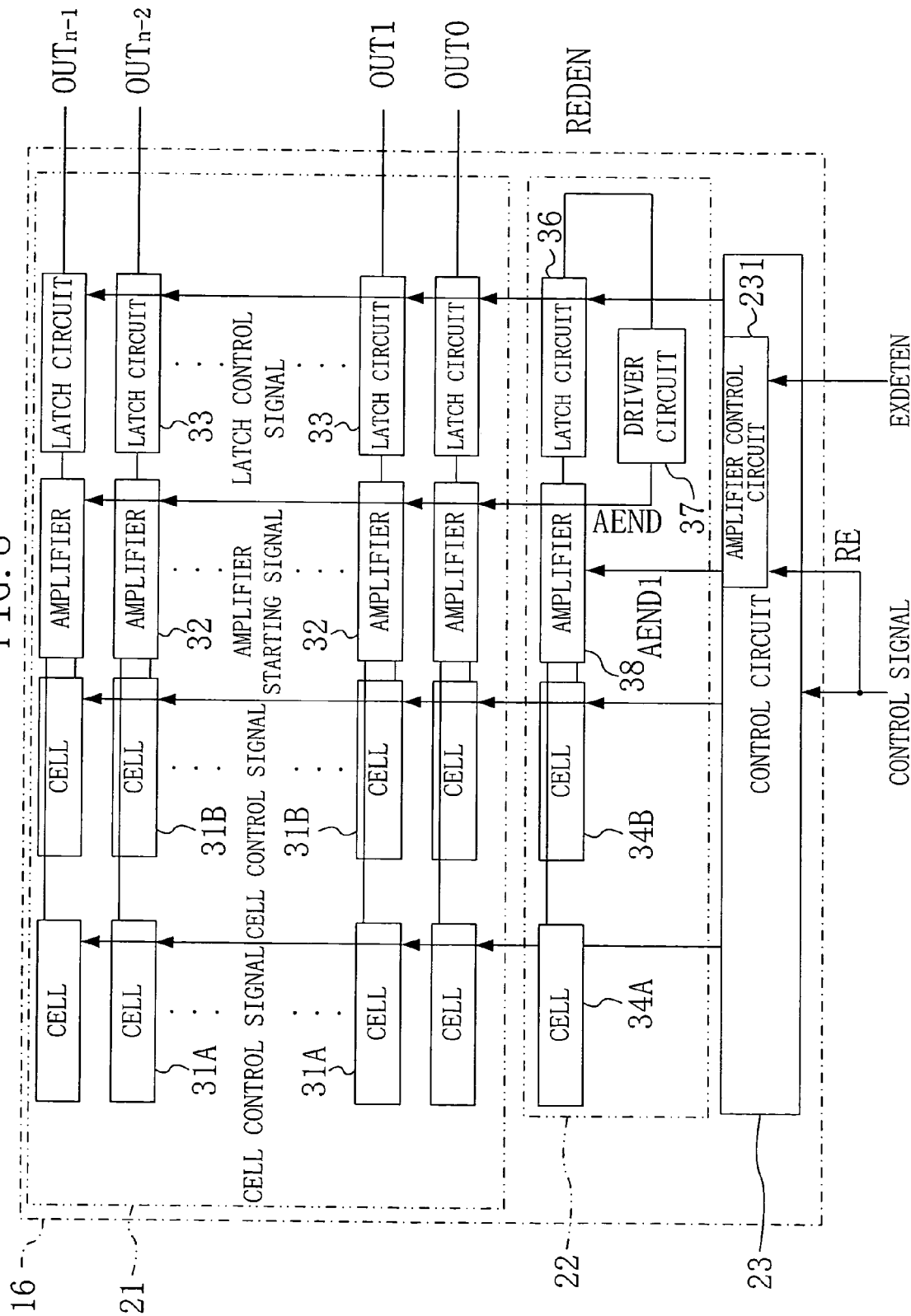
FIG. 8 is a block diagram showing an initialization information storage circuit according to the fourth embodiment of the present invention.

FIG. 8 shows an exemplary configuration of an initialization information storage circuit as an alternative to a fuse element according to the fourth embodiment of the present invention. The description of the components shown in FIG. 8 that are the same as those shown in FIGS. 4 and 6 will be omitted by retaining the same reference numerals.

Referring to FIG. 8, instead of the configuration in which the logical sum of the starting data pieces from the multiple starting memory cells 34 is used, the starting unit 22 according to the fourth embodiment is configured so that it is composed of a first starting memory cell 34A, a second starting memory cell 34B, and a differential amplifier 38 for differentially amplifying complementary starting data pieces from the starting memory cells 34A and 34B. This stabilizes the retentiveness of starting data for fixing the output values of the differential amplifiers 32 constituting the initialization information storage unit 21, which greatly improves the long-term reliability of the semiconductor device 10. Note that the differential amplifier 38 is configured similarly to the differential amplifier 32.

Moreover, in the fourth embodiment, the external reading signal RE and the external starting signal EXDETEN as an alternative to the internal starting signal DETEN are input to the amplifier control circuit 231 included in the control circuit 23. These signals are subjected to an AND operation, and the resulting signal is output, as a signal AEND1 for staring the amplifier of the starting unit (starting unit amplifier starting signal AEND1), to the differential amplifier 38 of the starting unit 22.

Figure 9:
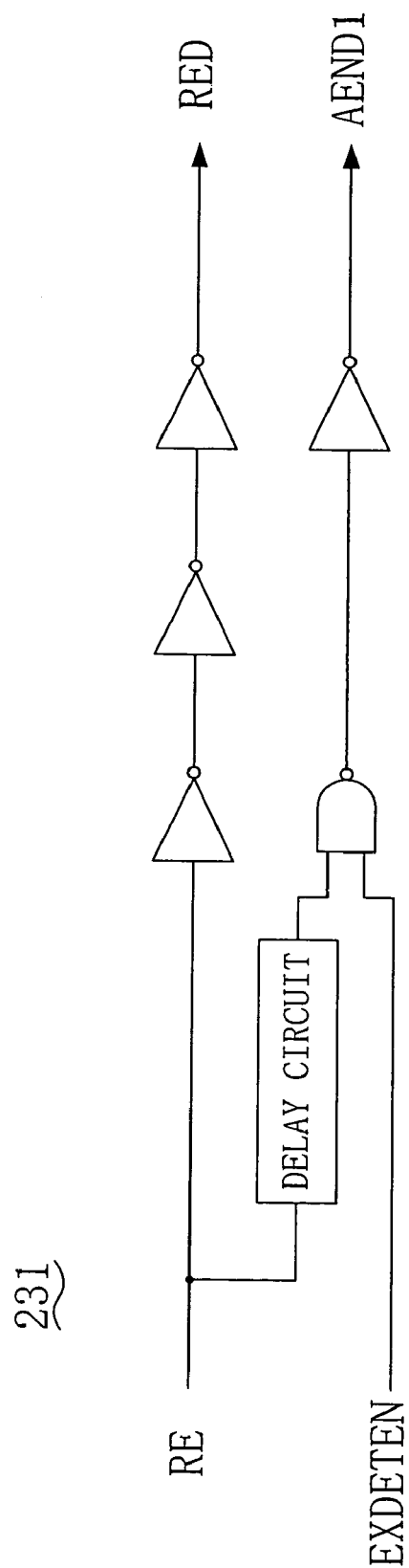
FIG. 9 is a circuit diagram showing main parts of an amplifier control circuit according to the fourth embodiment of the present invention.

FIG. 9 shows an exemplary configuration of the amplifier control circuit 231 according to the fourth embodiment, in which the external reading signal RE and the external starting signal EXDETEN are subjected to an AND operation. As shown in FIG. 9, the starting unit amplifier starting signal AEND1 transitions to a high level only after both the external reading signal RE and the external starting signal EXDETEN become a high level. Therefore, only after the starting unit amplifier starting signal AEND1 at a high level is received from the amplifier control circuit 231, the differential amplifier 38 of the starting unit 22 can activate the individual differential amplifiers 32 constituting the initialization information storage unit 21.

With such a configuration, in testing the circuits 11 to 15 constituting the semiconductor device 10 at the time of completion of an initial wafer fabrication step in the device fabrication process, the external starting signal EXDETEN can be set at a low level to test those circuits in the state in which the output signals OUT0 to OUTn-1 from the differential amplifiers 32 are fixed at a high level. In this test, the differential amplifier 38 of the starting unit 22 and the differential amplifiers 32 of the initialization information storage unit 21 become inactivated.

Therefore, if data stored in the initialization information storage unit 21 is unnecessary, the external starting signal EXDETEN is programmed at a low level so that the control signal REDEN from the differential amplifier 38 of the starting unit 22 becomes a low level. Only by this programming, the output signals OUT0 to OUTn-1 from the differential amplifiers 32 of the initialization information storage unit 21 can be fixed at a high level.

On the other hand, if data stored in the initialization information storage unit 21 is necessary, the memory cells 34A and 34B of the starting unit 22 are programmed to be complementary to each other so that the control signal REDEN from the differential amplifier 38 becomes a high level, and simultaneously the external reading signal RE and the external starting signal EXDETEN at a high level are input. By this procedure, the differential amplifiers 32 of the initialization information storage unit 21 can be made activated to read the written data.

There is no need to input the external starting signal EXDETEN from an external terminal in assembling the chip. For example, by providing the signal input as wiring for keeping the signal at a high level, even control data can be read with reliability after the chip assembly.

Alternatively, when a corresponding signal to the external starting signal EXDETEN is pulled up inside the chip and the input terminal for the signal EXDETEN is made open, the same effect can be obtained.

As described above, in the first to fourth embodiments, if the initialization information storage circuit 16 with the differential amplifier type nonvolatile memory elements capable of maintaining high reliability is used as an alternative to a fuse element, variation in the initial output potentials from the nonvolatile memory elements can be prevented. Therefore, in both cases where initialization data is necessary and not necessary, the output value of the output signal OUT from the initialization information storage circuit 16 can be fixed at any value.

Accordingly, the present invention is of usefulness in semiconductor integrated circuit devices provided with a nonvolatile memory element capable of exchanging a fuse element for determining a circuit-by-circuit operation after the device fabrication such as redundancy repair, functional expansion, functional modification, and in methods for testing such a device.

What is claimed is:

1. A semiconductor integrated circuit device comprising:
   first and second nonvolatile memory elements;
   a first amplifier for amplifying an output signal from the first nonvolatile memory element to output the amplified signal; and
   a second amplifier for outputting to the first amplifier a control signal generated by amplifying an output signal from the second nonvolatile memory element,
   wherein the second amplifier fixes an output signal from the first amplifier at a high potential or a low potential based on data stored in the second nonvolatile memory element.

2. The device of claim 1,
   wherein the output signal from the first amplifier is determined by a single control signal.

3. The device of claim 1, further comprising a third nonvolatile memory element,
   wherein the first amplifier is a first differential amplifier having a plurality of transistors of which gates of at least two transistors receive output signals from the first and third nonvolatile memory elements.

4. The device of claim 3,
   wherein the first differential amplifier receives a control signal for determining the output value of the first differential amplifier to fix the output signal of the first differential amplifier at a high potential, thereby inactivating the first differential amplifier.

5. The device of claim 1,
   wherein the semiconductor integrated circuit device includes a plurality of pairs each consisting of the second nonvolatile memory element and the second amplifier, and
   control signals each output from the second amplifier in each of the plurality of pairs are subjected to an OR operation to output the resulting signal to the first amplifier.

6. The device of claim 1,
   wherein the control signal output from the second amplifier as well as a reading signal are subjected to an AND operation to output the resulting signal to the first amplifier.

7. The device of claim 1, further comprising a fourth nonvolatile memory element,
   wherein the second amplifier is a second differential amplifier having a plurality of transistors of which gates of at least two transistors receive output signals from the second and fourth nonvolatile memory elements,
   the semiconductor integrated circuit device includes one or more groups each consisting of the second and fourth nonvolatile memory elements and the second differential amplifier, and
   the second differential amplifier outputs the control signal.

8. The device of claim 1,
   wherein the control signal output from the second amplifier as well as a reading signal are subjected to an AND operation to output the resulting signal to the first amplifier.

9. The device of claim 7,
   wherein the control signal output from the second differential amplifier is generated by performing an AND operation on a reading signal and an external signal input to an external input terminal, and the generated signal is output to the first amplifier.

10. The device of claim 9,
    wherein the external input terminal is used for a test process after fabrication of the device, and
    by activating the second differential amplifier after the test process, the first amplifier becomes activated and the external input terminal is fixed at a predetermined voltage level.

11. The device of claim 1,
    wherein the first nonvolatile memory element and the second nonvolatile memory element each comprise: a p-type transistor whose source and drain and a substrate are connected to one another to form a control gate; and an n-type transistor whose gate is connected to a gate of the p-type transistor to form a floating gate.

12. A method for testing a semiconductor integrated circuit device which comprises: first and second nonvolatile memory elements; a first amplifier for amplifying an output signal from the first nonvolatile memory element to output the amplified signal; and a second amplifier for outputting to the first amplifier a control signal generated by amplifying an output signal from the second nonvolatile memory element,
    wherein if the threshold value of the second nonvolatile memory element obtained after fabrication of the device is relatively low and a program for determining data to be stored in the first nonvolatile memory element is unnecessary, a program for the second nonvolatile memory element is not conducted, and
    if the threshold value of the second nonvolatile memory element after the device fabrication is relatively high and the program for determining data to be stored in the first nonvolatile memory element is necessary, data for activating the first amplifier is programmed into the second nonvolatile memory element determining the output potential of the first amplifier and predetermined data is written in the first nonvolatile memory element.

13. The method of claim 12,
    wherein the first nonvolatile memory element and the second nonvolatile memory element each comprise: a p-type transistor whose source and drain and a substrate are connected to one another to form a control gate; and an n-type transistor whose gate is connected to a gate of the p-type transistor to form a floating gate.

14. A method for testing a semiconductor integrated circuit device which comprises: first, second and third nonvolatile memory elements; a first amplifier for amplifying an output signal from the first nonvolatile memory element to output the amplified signal; and a second amplifier for outputting to the first amplifier a control signal generated by amplifying an output signal from the second nonvolatile memory element, the second amplifier being a differential amplifier having a plurality of transistors of which gates of at least two transistors receive output signals from the second and third nonvolatile memory elements, the semiconductor integrated circuit device including one or more groups each consisting of the second and third nonvolatile memory elements and the differential amplifier, the differential amplifier outputting the control signal, the control signal being generated by performing an AND operation on a reading signal and an external signal input to an external input terminal, the generated signal being output to the first amplifier, the method comprising:
- a first step of erasing, if the threshold value of the second nonvolatile memory element after fabrication of the device is relatively high, data pieces stored in the first nonvolatile memory element and the second nonvolatile memory element; and
- a second step of inputting a signal for test from the external input terminal to test a target circuit receiving the output signal from the first amplifier.

15. The method of claim 14,
wherein the first nonvolatile memory element and the second nonvolatile memory element each comprise: a p-type transistor whose source and drain and a substrate are connected to one another to form a control gate; and an n-type transistor whose gate is connected to a gate of the p-type transistor to form a floating gate.

16. A method for testing a semiconductor integrated circuit device which comprises: first, second and third nonvolatile memory elements; a first amplifier for amplifying an output signal from the first nonvolatile memory element to output the amplified signal; and a second amplifier for outputting to the first amplifier a control signal generated by amplifying an output signal from the second nonvolatile memory element, the second amplifier being a differential amplifier having a plurality of transistors of which gates of at least two transistors receive output signals from the second and third nonvolatile memory elements, the semiconductor integrated circuit device including one or more groups each consisting of the second and third nonvolatile memory elements and the differential amplifier, the differential amplifier outputting the control signal, the control signal being generated by performing an AND operation on a reading signal and an external signal input to an external input terminal, the generated signal being output to the first amplifier, the method comprising the steps of:
- inputting a signal to the external input terminal so that the differential amplifier becomes inactivated and fixing the output signal of the differential amplifier at a high level or a low level, thereby conducting a test with the output value of the first amplifier fixed at the same value as or the inverse value of the output value of the differential amplifier;
- conducting, if a program for determining data to be stored in the first nonvolatile memory element is unnecessary, a program on the second nonvolatile memory element so that the differential amplifier becomes inactivated; and
- conducting, if the program for determining data to be stored in the first nonvolatile memory element is necessary, a program on the second nonvolatile memory element so that the differential amplifier becomes activated and writing predetermined data in the first nonvolatile memory element.

17. The method of claim 16,
wherein the first nonvolatile memory element and the second nonvolatile memory element each comprise: a p-type transistor whose source and drain and a substrate are connected to one another to form a control gate; and an n-type transistor whose gate is connected to a gate of the p-type transistor to form a floating gate.

* * * * *